United States Patent
Xu

(10) Patent No.: US 11,988,954 B2
(45) Date of Patent: May 21, 2024

(54) OPTICAL PROXIMITY EFFECT CORRECTION METHOD AND APPARATUS, DEVICE AND MEDIUM

(71) Applicant: CHANGXIN MEMORY TECHNOLOGIES, INC., Anhui (CN)

(72) Inventor: Jin Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 17/310,858

(22) PCT Filed: Mar. 8, 2021

(86) PCT No.: PCT/CN2021/079585
§ 371 (c)(1),
(2) Date: Aug. 26, 2021

(87) PCT Pub. No.: WO2021/180042
PCT Pub. Date: Sep. 16, 2021

(65) Prior Publication Data
US 2022/0317556 A1    Oct. 6, 2022

(30) Foreign Application Priority Data
Mar. 13, 2020 (CN) .......................... 202010175353.0

(51) Int. Cl.
*G03F 1/36*    (2012.01)

(52) U.S. Cl.
CPC ...................... *G03F 1/36* (2013.01)

(58) Field of Classification Search
CPC ....................................................... G03F 1/36
See application file for complete search history.

(56) References Cited

U.S. PATENT DOCUMENTS

| 6,523,162 | B1 | 2/2003 | Agrawal et al. |
| 7,124,395 | B2 | 10/2006 | Shi et al. |
| 7,694,267 | B1* | 4/2010 | Ye ............................... G03F 1/36 |
| | | | 716/53 |
| 8,601,419 | B1* | 12/2013 | Chiang ................. G06F 30/398 |
| | | | 716/112 |
| 8,782,572 | B1* | 7/2014 | Huang ...................... G03F 1/36 |
| | | | 716/54 |

(Continued)

FOREIGN PATENT DOCUMENTS

| CN | 103984200 A | 8/2014 |
| CN | 104865788 A | 8/2015 |

OTHER PUBLICATIONS

International Search Report in Application No. PCT/CN2021/079585 mailed on May 28, 2021.

*Primary Examiner* — Nha T Nguyen
(74) *Attorney, Agent, or Firm* — Syncoda LLC; Feng Ma

(57) ABSTRACT

A optical proximity effect correction method includes: fabricating a test pattern mask according to design rules of a target pattern; obtaining data required by an optical proximity effect correction model, and establishing the optical proximity effect correction model; obtaining line end shortening data of the test pattern, and establishing a line end shortening rule table; determining an initial correction value according to the line end shortening rule table; and correcting the target pattern according to the initial correction value and the optical proximity effect correction model.

17 Claims, 5 Drawing Sheets

(56) References Cited

U.S. PATENT DOCUMENTS

| | | | |
|---|---|---|---|
| 10,386,713 B2* | 8/2019 | Jeong | G03F 1/36 |
| 10,671,052 B2 | 6/2020 | Beylkin et al. | |
| 11,853,662 B2* | 12/2023 | Srinivasan | G06F 30/3323 |
| 2005/0196686 A1* | 9/2005 | Meyer | G03F 1/36 |
| | | | 430/30 |
| 2010/0129740 A1* | 5/2010 | Wang | G03F 1/36 |
| | | | 430/30 |
| 2011/0179391 A1* | 7/2011 | Culp | G03F 1/36 |
| | | | 716/139 |
| 2016/0125120 A1* | 5/2016 | Yu | H01L 21/027 |
| | | | 716/52 |
| 2017/0053058 A1* | 2/2017 | Yu | G06F 30/398 |
| 2018/0004079 A1* | 1/2018 | Chen | G03F 1/36 |
| 2022/0309222 A1* | 9/2022 | Abercrombie | G06F 30/398 |

* cited by examiner

OPTICAL PROXIMITY EFFECT CORRECTION METHOD AND APPARATUS, DEVICE AND MEDIUM

CROSS-REFERENCE TO RELATED APPLICATIONS

This application is a national stage of International Application No. PCT/CN2021/079585 filed on Mar. 8, 2021, which claims priority to Chinese Patent Application No. 202010175353.0 filed on Mar. 13, 2020. The disclosures of these applications are hereby incorporated by reference in their entirety.

TECHNICAL FIELD

Embodiments of the present disclosure relate to the field of semiconductor manufacturing, and in particular to an optical proximity effect correction method and apparatus, a device, and a medium.

BACKGROUND

Model-based optical proximity correction (OPC) has been widely used since the 180 nm technology node. It uses the optical model and photoresist chemical reaction model to calculate the pattern after exposure.

Line end shortening (LES) in photolithography pattern distortion refers to the fact that the actual pattern length on the wafer is less than the design pattern length. This distortion deviation comes from the spatial optical image distortion caused by the loss of high-frequency information in the photolithography diffraction imaging process. The distortion degree of the spatial optical image is closely related to the feature size. With the decrease of the feature size, the line end shortening increases significantly. This will lead to the insufficient coverage of devices in the active layer and gate layer or of the metal layer and through-hole layer, resulting in the deteriorated performance of circuit devices. Therefore, it is necessary to correct the length of the line end of masks during the OPC.

During the OPC, for all patterns to be corrected, the edges of the patterns are segmented according to the prediction of the OPC model, and the segments are moved so that the photoresist shape of the patterns reaches the target value. However, with more and more advanced photolithography processes, the optical diffraction effect is becoming more serious, and the patterns will have quite great line end shortening. Meanwhile, in order to ensure the patterns to reach the target value on the wafer, during the OPC, the patterns will be moved outward by a considerable distance which is in the order of 50 nm to 100 nm, to obtain the expected OPC results. During the OPC, poor convergence of OPC may occur, resulting in too long correction time and affecting the fabrication of the mask and even the production progress of the product.

SUMMARY

Embodiments of the present disclosure provide an optical proximity effect correction method and apparatus, a device, and a medium, to improve the convergence of the optical proximity effect correction in correcting the line end shortening, improve the correction efficiency, and reduce the operating time for optical proximity effect correction.

In a first aspect, an embodiment of the present disclosure provides an optical proximity effect correction method, comprising:
    fabricating a test pattern mask according to design rules of a target pattern;
    obtaining data required by an optical proximity effect correction model, and establishing the optical proximity effect correction model;
    obtaining line end shortening data of the test pattern, and establishing a line end shortening rule table;
    determining an initial correction value according to the line end shortening rule table; and
    correcting the target pattern according to the initial correction value and the optical proximity effect correction model.

In an embodiment, the method further comprises:
    cyclically performing the correcting the target pattern until the line end shortening of the target pattern reaches to a target value.

In an embodiment, after the obtaining data required by an optical proximity effect correction model and establishing the optical proximity effect correction model, the method further comprises:
    verifying the optical proximity effect correction model, and comparing line end shortening data obtained by the optical proximity effect correction model with the line end shortening data of the test pattern; and
    determining the optical proximity effect correction model meets application conditions if an absolute value of a difference between the line end shortening data obtained by the optical proximity effect correction model and the line end shortening data of the test pattern is less than or equal to a preset threshold.

In an embodiment, the method further comprises:
    if the absolute value of the difference between the line end shortening data obtained by the optical proximity effect correction model and the line end shortening data of the test pattern is greater than the preset threshold, performing model-based optical proximity effect correction until the absolute value of the difference between the line end shortening data obtained by the optical proximity effect correction model and the line end shortening data of the test pattern is less than or equal to the preset threshold.

In an embodiment, when photolithography conditions change, the optical proximity effect correction model and the line end shortening rule table are re-established.

In an embodiment, the line end shortening rule table comprises pattern line widths, pattern spacings, and line end shortening lengths corresponding to the pattern line widths and the pattern spacings.

In an embodiment, the determining an initial correction value according to the line end shortening rule table comprises:
    using a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;
    using a corresponding line end shortening length in the line end shortening rule table as the initial correction value, if the pattern line width and the pattern spacing of the target pattern are both in the line end shortening rule table; and using 0 as the initial correction value, if the pattern line width and the pattern spacing of the target pattern are respectively greater than a maximum value of the pattern line width and a maximum value of the pattern spacing in the line end shortening rule table.

In an embodiment, the initial correction value is 70 nm when the minimum value of the pattern line width and the minimum value of pattern spacing are both 50 nm.

the initial correction value is between 0 nm and 70 nm when the pattern line width and the pattern spacing are both between 50 nm and 100 nm; and the initial correction value is 0 nm when the maximum value of the pattern line width and the maximum value of pattern spacing are both 100 nm.

In a second aspect, an embodiment of the present disclosure provides an optical proximity effect correction apparatus, comprising:

a test pattern generation module, configured to fabricate a test pattern mask according to design rules of a target pattern;

a model establishment module, configured to obtain data required by an optical proximity effect correction model and establish the optical proximity effect correction model;

a rule table establishment module, configured to obtain line end shortening data of the test pattern and establish a line end shortening rule table;

an initial value setting module, configured to determine an initial correction value according to the line end shortening rule table; and a correction module, configured to correct the target pattern according to the initial correction value and the optical proximity effect correction model.

In a third aspect, an embodiment of the present disclosure further provides a computer device, comprising:

one or more processors; and a storage apparatus, configured to store one or more programs;

when the one or more programs are executed by the one or more processors, the one or more processors implement the optical proximity effect correction method described above.

In a fourth aspect, an embodiment of the present disclosure further provides a computer-readable storage medium having computer programs stored thereon, wherein, the programs, when executed by a processor, implement any optical proximity effect correction method described above.

By the optical proximity effect correction method according to the embodiments of the present disclosure, a test pattern mask is fabricated according to design rules of a target pattern, and photolithography tests are performed by using the test pattern mask; data required by an optical proximity effect correction model is obtained, and the optical proximity effect correction model is established; line end shortening data of the test pattern is obtained, and a line end shortening rule table is established; an initial correction value is determined according to the line end shortening rule table; and the target pattern is corrected according to the initial correction value and the optical proximity effect correction model. Determining the initial correction value for the optical proximity effect correction by establishing the line end shortening rule table and performing the optical proximity effect correction by using the initial correction value can effectively improve the convergence of the optical proximity effect correction in correcting the line end shortening, improve the correction efficiency, reduce the operating time for optical proximity effect correction, and thus improving the semiconductor manufacturing efficiency.

DETAILED DESCRIPTION

The present disclosure will be further described below with reference to the accompanying drawings by embodiments. It may be understood that the specific embodiments to be described herein are only used to explain the present disclosure, rather than limiting the present disclosure. In addition, it should be noted that, for ease of description, only a part of the structure related to the present disclosure is shown in the accompanying drawings instead of all of the structure.

Figure 1:
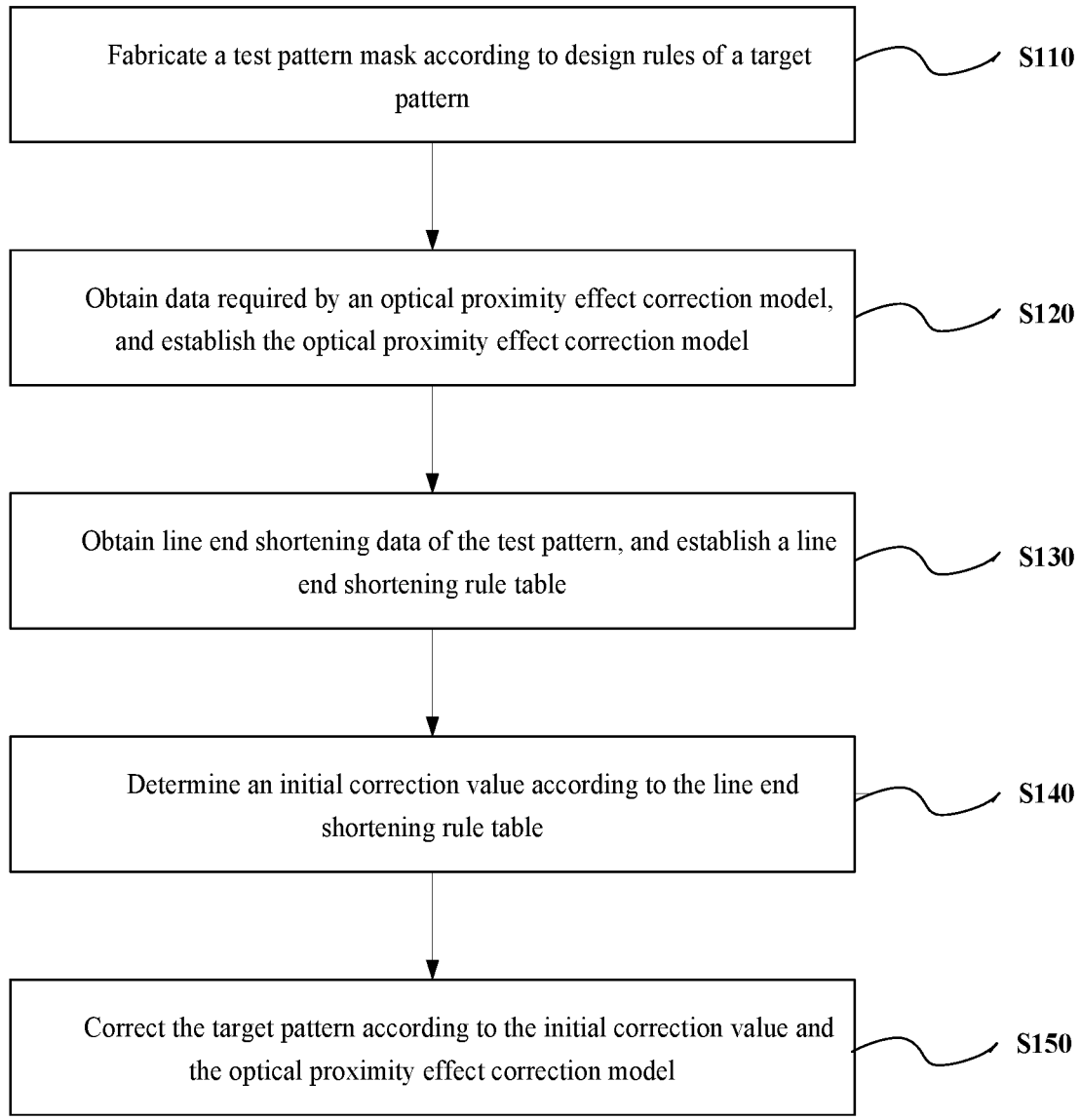
FIG. 1 is a schematic flowchart of an optical proximity effect correction method according to an embodiment of the present disclosure.

FIG. 1 is a schematic flowchart of an optical proximity effect correction method according to an embodiment of the present disclosure. This embodiment may be applied to the optical proximity effect correction in the photolithography process. The method may be executed by an optical proximity effect correction apparatus which may be implemented by software and/or hardware. For example, the optical proximity effect correction apparatus may be configured in a computer device. As shown in FIG. 1, the optical proximity effect correction method comprises the following steps.

S110: A test pattern mask is fabricated according to design rules of a target pattern.

In this embodiment, the target pattern is an original layout pattern, and a test pattern mask is fabricated according to the design rules of the original layout pattern. The test pattern mask may comprise various types of test patterns, for example line test patterns, hole test patterns, and the like. For example, when the target pattern is a line pattern, the design rules of the line pattern comprise the target line width of the line pattern, the target length of the line pattern, the target spacing between the line patterns, etc. According to these conditions, a test pattern may be designed. In the following embodiments, the target pattern being a line pattern is taken as an example, which is not a limitation to the embodiments of the present disclosure.

S120: Data required by an optical proximity effect correction model is obtained, and the optical proximity effect correction model is established.

In this embodiment, according to the currently used photolithography process conditions, for example illumination mode, photoresist type, photoresist thickness, etc., the photolithography process is performed by the test pattern mask. Various data of the test pattern on the wafer may be collected, and an optical correction model is established based on the collected data.

After establishing the optical proximity effect correction model, it is necessary to verify the optical proximity effect correction model. In an embodiment, when the test pattern is a line pattern, the optical proximity effect correction model may be verified by the line pattern. The process comprises: comparing the line end shortening data of the line pattern obtained by the optical proximity effect correction model with the line end shortening data of the line pattern on the wafer obtained by the exposure by using the test pattern mark; and determining that the optical proximity effect correction model meets the application conditions, if the absolute value of the difference between the line end shortening data of the line pattern obtained by the optical proximity effect correction model with the line end shortening data of the line pattern on the wafer obtained by the exposure by using the test pattern mark.

It may be understood that, in the specific implementation process, by running the optical proximity effect correction model, the line end shortening data in the simulation result may be obtained. The target size of the line pattern is known. The actual size of the line on the wafer obtained by the exposure by using the test pattern mark may be measured. The line end shortening data during the test may be obtained by comparing the target size of the line pattern and the actual size of the line on the wafer. By comparing the two pieces of line end shortening data, the error of the optical proximity effect correction model may be obtained. Exemplarily, in this embodiment, the preset threshold may be set to 10 nm. Further, if the absolute value of the difference between the line end shortening data obtained by the optical proximity effect correction model and the line end shortening data of the line pattern is greater than the preset threshold, model-based optical proximity effect correction is performed until the absolute value of the difference between the line end shortening data obtained by the optical proximity effect correction model and the line end shortening data of the line pattern is less than or equal to the preset threshold. When there is a large error in the optical proximity effect correction model, the optical proximity effect model may be adjusted first, to avoid too low speed during correction and improve the efficiency of optical proximity effect correction. The use of model-based optical proximity effect correction can correct all target patterns quickly and conveniently.

S130: Line end shortening data of the test pattern is obtained, and a line end shortening rule table is established.

In this embodiment, when photolithography tests are performed by using the test pattern mask, the line end shortening data of the test pattern may also be obtained, and a line end shortening rule table is established according to the line end shortening data. In an embodiment, the line end shortening rule table comprises a pattern line width, a pattern spacing, and a line end shortening length corresponding to the pattern line width and the pattern spacing. Specifically, the pattern spacing is the distance between two sides of two adjacent patterns or the distance between the centers of two adjacent patterns.

Figure 2:
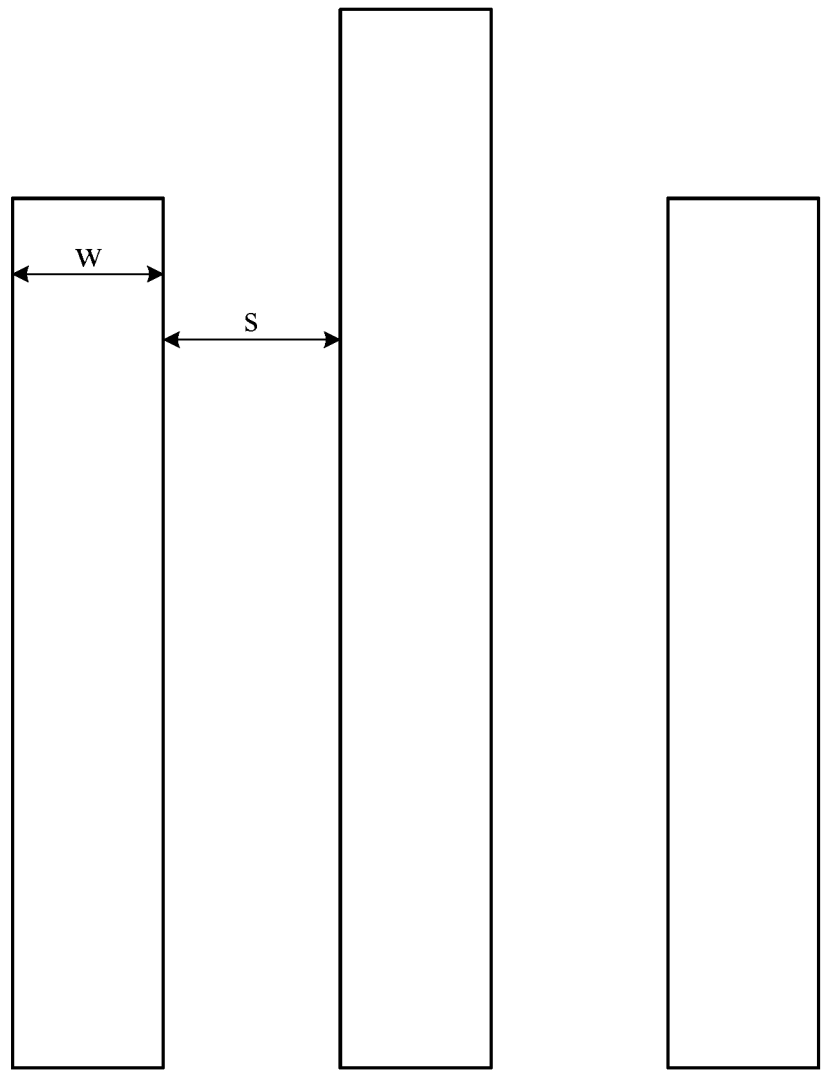
FIG. 2 is a schematic structure diagram of a test pattern according to an embodiment of the present disclosure.

Exemplarily, FIG. 2 is a schematic structure diagram of a test pattern according to an embodiment of the present disclosure. FIG. 2 schematically shows three linear patterns, wherein the pattern line width represents the width of the pattern, which is indicated by w in FIG. 2; the pattern spacing represents the distance between two adjacent sides of two adjacent lines, which is indicated by s in FIG. 2. It may be understood that, when w and/or s are different, the line end shortening length varies. Table 1 shows a line end shortening table in the embodiments of the present disclosure, wherein the first row represents the pattern spacing s (unit: nm), the first column represents the pattern line width w (unit: nm), and the others are the corresponding line end shortening lengths (unit: nm).

TABLE 1

Line End Shortening Table

|  | 50 | 55 | 60 | 65 | 70 | 75 | 80 | 85 | 90 | 95 | 100 |
| --- | --- | --- | --- | --- | --- | --- | --- | --- | --- | --- | --- |
| 50 | 70 | 68 | 66 | 64 | 62 | 60 | 57 | 54 | 51 | 48 | 45 |
| 55 | 66 | 65 | 64 | 62 | 60 | 58 | 55 | 52 | 49 | 46 | 43 |
| 60 | 62 | 61 | 59 | 58 | 58 | 57 | 54 | 51 | 48 | 45 | 42 |
| 65 | 58 | 57 | 55 | 54 | 53 | 51 | 50 | 50 | 48 | 44 | 41 |
| 70 | 55 | 54 | 52 | 51 | 50 | 49 | 48 | 48 | 47 | 43 | 40 |
| 75 | 50 | 49 | 47 | 46 | 45 | 44 | 44 | 44 | 43 | 42 | 39 |
| 80 | 45 | 44 | 42 | 41 | 40 | 38 | 38 | 38 | 36 | 36 | 35 |
| 85 | 40 | 39 | 37 | 36 | 35 | 34 | 34 | 33 | 33 | 32 | 32 |
| 90 | 34 | 33 | 31 | 30 | 29 | 27 | 27 | 26 | 25 | 24 | 23 |
| 95 | 28 | 27 | 25 | 24 | 23 | 21 | 20 | 20 | 18 | 18 | 16 |
| 100 | 22 | 21 | 19 | 18 | 17 | 16 | 15 | 15 | 15 | 14 | 12 |

S140: An initial correction value is determined according to the line end shortening rule table.

In an embodiment, determining an initial correction value according to the line end shortening rule table comprises:
using a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;
using a corresponding line end shortening length in the line end shortening rule table as the initial correction value, if the pattern line width and the pattern spacing of the target pattern are both in the line end shortening rule table; and
using 0 as the initial correction value, if the pattern line width and the pattern spacing of the target pattern are respectively greater than a maximum value of the pattern line width and a maximum value of the pattern spacing in the line end shortening rule table.

In an embodiment, the initial correction value is 70 nm when the minimum value of the pattern line width and the minimum value of the pattern spacing are both 50 nm;
the initial correction value is between 0 nm and 70 nm when the pattern line width and the pattern spacing are both between 50 nm and 100 nm; and
the initial correction value is 0 nm when the maximum value of the pattern line width and the maximum value of pattern spacing are both 100 nm.

Exemplarily, when w<50 nm and s<50 nm, the initial correction value obtained from the line end shortening rule table is 70 nm; when w=70 nm, s=70 nm, the initial correction value obtained from the line end shortening rule table is 50 nm; and when w>100 nm, s>100 nm, the initial correction value is 0.

In the specific implementation, there may be many data in the line end shortening rule table. For simplicity, an initial value may be substituted for values in a similar interval. Exemplarily, when w is between 60 nm and 80 nm and s is between 60 nm and 80 nm, the initial values are both 50 nm. This can effectively simplify the algorithm of the initial correction value and improve the correction efficiency. The initial value may be selected according to actual conditions during specific implementation, which is not limited in the embodiments of the present disclosure.

S150: The target pattern is corrected according to the initial correction value and the optical proximity effect correction model. The initial correction value obtained in the above step is substituted into the optical proximity effect correction model to perform the optical proximity effect correction of the target pattern. Since the initial correction value obtained from the line end shortening rule table is already close to the line end shortening in actual photolithography, starting the correction from the initial correction value can improve the correction efficiency. Specifically, the correction of the target pattern by the optical proximity effect correction model comprises model-based optical proximity effect correction.

By the technical solution of the embodiment of the present disclosure, a test pattern mask is fabricated according to design rules of a target pattern, and the photolithography process is performed by using the test pattern mask; data required by an optical proximity effect correction model is obtained, and the optical proximity effect correction model is established; line end shortening data of the test pattern is obtained, and a line end shortening rule table is established; an initial correction value is determined according to the line end shortening rule table; and the target pattern is corrected according to the initial correction value and the optical proximity effect correction model. Determining the initial correction value for the optical proximity effect correction by establishing the line end shortening rule table and performing the optical proximity effect correction by using the initial correction value can effectively improve the convergence of the optical proximity effect correction in correcting the line end shortening, improve the correction efficiency, reduce the time for optical proximity effect correction, and thus improve the semiconductor manufacturing efficiency.

Figure 3:
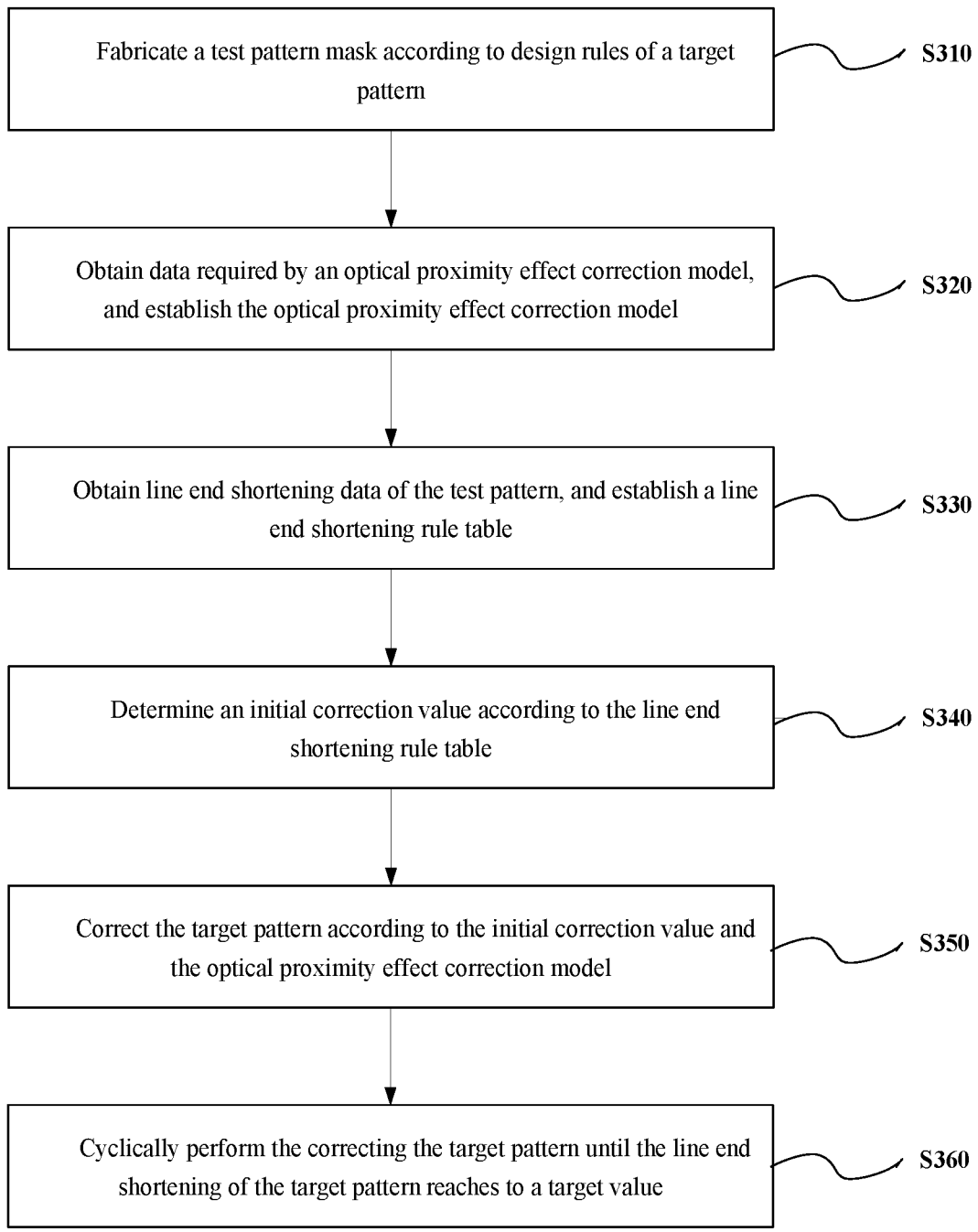
FIG. 3 is a schematic flowchart of another optical proximity effect correction method according to an embodiment of the present disclosure.

Based on the above embodiment, FIG. 3 is a schematic flowchart of another optical proximity effect correction method according to an embodiment of the present disclosure. Referring to FIG. 3, the optical proximity effect correction method according to this embodiment comprises:

S310: A test pattern mask is fabricated according to design rules of a target pattern.
S320: Data required by an optical proximity effect correction model is obtained, and the optical proximity effect correction model is established.
S330: Line end shortening data of the test pattern is obtained, and a line end shortening rule table is established.
S340: An initial correction value is determined according to the line end shortening rule table.
S350: The target pattern is corrected according to the initial correction value and the optical proximity effect correction model.
S360: The correcting the target pattern is cyclically performed until the line end of the target pattern reaches to a target value.

Figure 4:
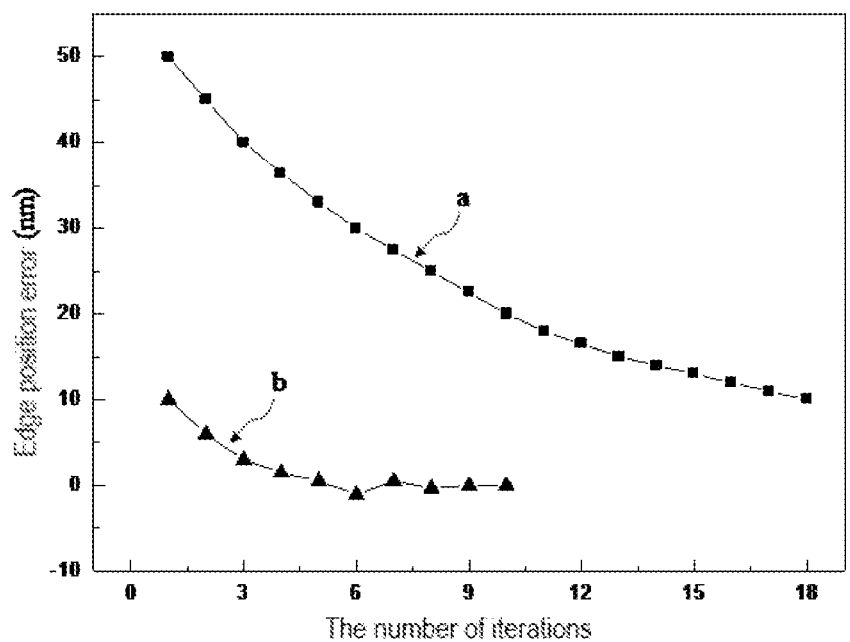
FIG. 4 is a schematic diagram of the optical proximity effect correction results in the prior art and in an embodiment of the present disclosure.

It may be understood that, in specific implementations, the target value may not be reached by only one optical proximity effect correction, and iterative correction is required. FIG. 4 is a schematic diagram of the optical proximity effect correction results in the prior art and in an embodiment of the present disclosure, where the curve a is the optical proximity effect correction result in the prior art. It may be found from the curve a that, in the prior art, after 18 iterations, the edge position error (EPE) is still 10 nm and the correction result shows poor convergence; it may be found from curve b that, after the initial correction value is set according to the line end shortening rule table in this embodiment (specifically, the initial correction value is 70 nm when w<50 nm and s<50 nm; the initial correction value is 50 nm when 50 nm≤w≤100 nm and 50 nm≤s≤100 nm; the initial correction value is 0 when w>100 nm and s>100 nm), the EPE corrected by the optical proximity effect correction model, which is already verified by the preset threshold of 10 nm, converges to almost 0 after 5 to 6 iterations, and the target value is reached. It may be found that the optical proximity effect correction method in this embodiment can reduce the number of iterations, reduce the correction time, and improve the efficiency.

On the basis of the above embodiment, in an embodiment, when the photolithography conditions change, the optical proximity effect correction model and the line end shortening rule table are re-established.

It may be understood that, when the photolithography conditions change, the optical proximity effect correction model and the line end shortening rule table obtained under the original photolithography conditions are not applicable, and data needs to be recollected to establish a model to adapt to the new photolithography conditions.

Figure 5:
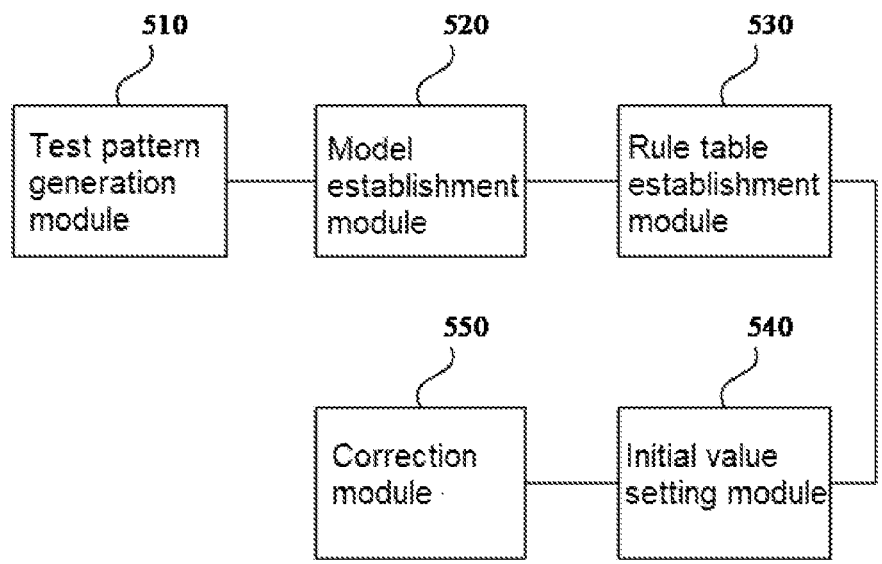
FIG. 5 is a schematic structure diagram of an optical proximity effect correction apparatus according to an embodiment of the present disclosure.

FIG. 5 is a schematic structure diagram of an optical proximity effect correction apparatus according to an embodiment of the present disclosure. The optical proximity effect correction apparatus may be implemented by software and/or hardware. For example, the optical proximity effect correction apparatus may be configured in a computer device. As shown in FIG. 5, the optical proximity effect correction apparatus in this embodiment comprises a test pattern generation module 510, a model establishment module 520, a rule table establishment module 530, an initial value setting module 540, and a correction module 550, wherein:

the test pattern generation module 510 is configured to fabricate a test pattern mask according to design rules of a target pattern;
the model establishment module 520 is configured to obtain data required by an optical proximity effect correction model and establish the optical proximity effect correction model;
the rule table establishment module 530 is configured to obtain line end shortening data of the test pattern and establish a line end shortening rule table;
the initial value setting module 540 is configured to determine an initial correction value according to the line end shortening rule table; and
the correction module 550 is configured to correct the target pattern according to the initial correction value and the optical proximity effect correction model.

In the embodiment of the present disclosure, by the test pattern generation module, a test pattern mask is fabricated according to design rules of a target pattern, and photolithography tests are performed by using the test pattern mask; by the model establishment module, data required by an optical proximity effect correction model is obtained, and the optical proximity effect correction model is established; by the rule table establishment module, line end shortening data of the test pattern is obtained, and a line end shortening rule table is established; by an initial value setting module, an initial correction value is determined according to the line end shortening rule table; and by the correction module, the target pattern is corrected according to the initial correction value and the optical proximity effect correction model. Determining the initial correction value for the optical proximity effect correction by establishing the line end shortening rule table and performing the optical proximity effect correction by using the initial correction value can effectively improve the convergence of the optical proximity effect correction in correcting the line end shortening, improve the correction efficiency, reduce the time for optical proximity effect correction, and thus improve the semiconductor manufacturing efficiency.

In an embodiment, on the basis of the above solution, the correction module 550 is further configured to:
cyclically perform the correcting the target pattern until the line end shortening of the target pattern reaches to a target value.

In an embodiment, on the basis of the above solution, the model establishment module 520 is further configured to:
verify the optical proximity effect correction model, and compare line end shortening data obtained by the optical proximity effect correction model with line end shortening data of the test pattern;
determine that the optical proximity effect correction model meets application conditions if the absolute value of the difference between the line end shortening data obtained by the optical proximity effect correction model and the line end shortening data of the test pattern is less than or equal to a preset threshold; and
if the absolute value of the difference between the line end shortening data obtained by the optical proximity effect correction model and the line end shortening data of the test pattern is greater than the preset threshold, perform model-based optical proximity effect correction until the absolute value of the difference between the line end shortening data obtained by the optical proximity effect correction model and the line end shortening data of the test pattern is less than or equal to the preset threshold.

In an embodiment, on the basis of the above solution, when the photolithography conditions change, the model establishment module 520 is further configured to re-establish the optical proximity effect correction model and the rule table establishment module 530 is further configured to establish the line end shortening rule table.

In an embodiment, on the basis of the above solution, the line end shortening rule table comprises a pattern line width, a pattern spacing, and a line end shortening length corresponding to the pattern line width and the pattern spacing. Specifically, the pattern spacing is the distance between two sides of two adjacent patterns or the distance between the centers of two adjacent patterns. The initial value setting module 540 is specifically configured to:
use a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;
use a corresponding line end shortening length in the line end shortening rule table as the initial correction value, if the pattern line width and the pattern spacing of the target pattern are both in the line end shortening rule table; and use 0 as the initial correction value, if the pattern line width and the pattern spacing of the target pattern are respectively greater than a maximum value of the pattern line width and a maximum value of the pattern spacing in the line end shortening rule table.

The optical proximity effect correction apparatus in this embodiment of the present disclosure can execute the optical proximity effect correction method in any embodiment of the present disclosure, and has corresponding functional modules for executing the method and beneficial effects.

Figure 6:
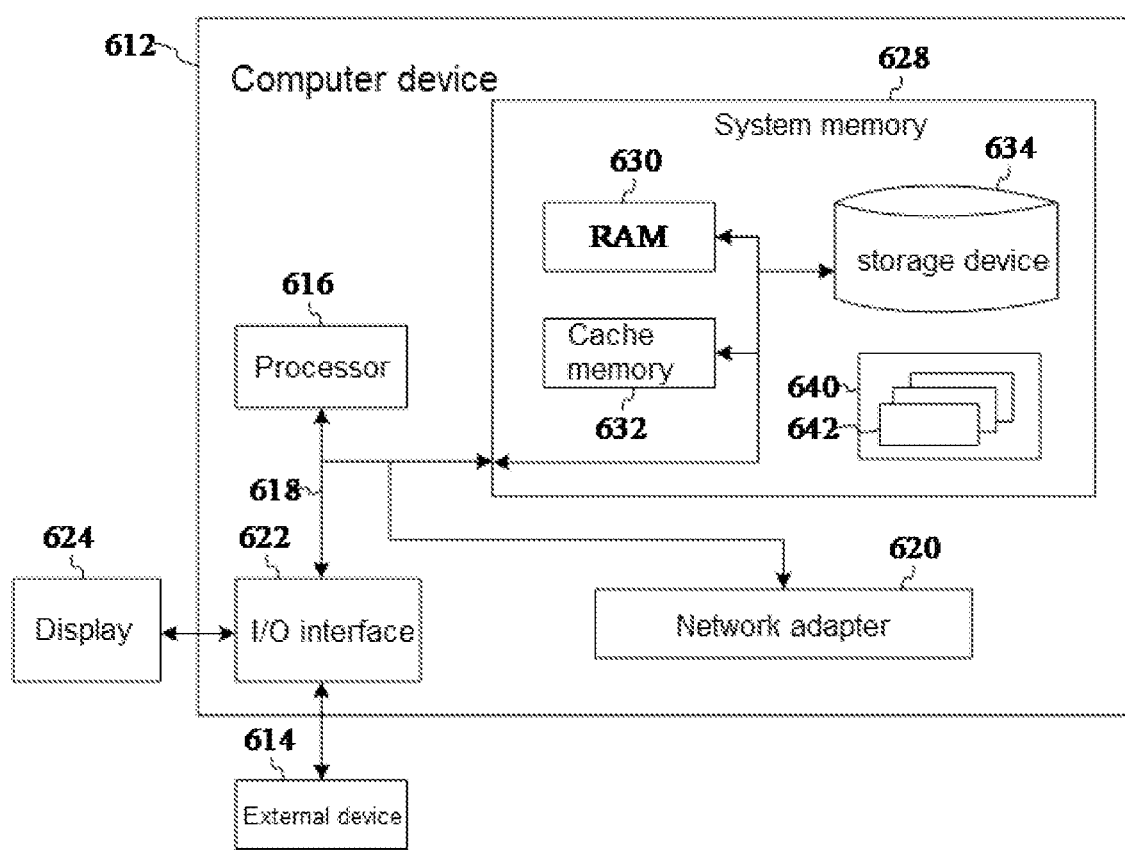
FIG. 6 is a schematic structure diagram of a computer device according to an embodiment of the present disclosure.

FIG. 6 is a schematic structure diagram of a computer device according to an embodiment of the present disclosure. FIG. 6 shows a block diagram of an exemplary computer device 612 suitable for implementing embodiments of the present disclosure. The computer device 612 shown in FIG. 6 is only an example, and does not form any limitation to the functions and application range of the embodiments of the present disclosure.

As shown in FIG. 6, the computer device 612 is embodied as a general-purpose computing device. The components of the computer device 612 may include, but are not limited to, one or more processors 616, a system memory 628, and a bus 618 connecting different system components (comprising the system memory 628 and the processor 616).

The bus 618 represents one or more of several types of bus structures, comprising memory buses or memory controllers, peripheral buses, accelerated graphics ports, processors 616, or local buses using any of multiple bus structures. For example, these architectures include but are not limited to industry standard architecture (ISA) buses, microchannel architecture (MAC) buses, enhanced ISA buses, video electronics standards association (VESA) local buses, and peripheral component interconnect (PCI) buses.

The computer device 612 typically comprises a variety of computer system readable media. These media may be any available media that may be accessed by the computer device 612, including volatile and nonvolatile media, removable and non-removable media.

The system memory 628 may comprise computer system readable media in the form of volatile memories, for example random access memories (RAMs) 630 and/or cache memories 632. The computer device 612 may further comprise other removable/non-removable, volatile/nonvolatile computer system storage media. As an example only, the storage device 634 may be used to read from and write to non-removable, non-volatile magnetic media (not shown in FIG. 6, generally referred to as "hard disk drives"). Although not shown in FIG. 6, a disk drive for reading from and writing to removable non-volatile disks (for example "floppy disks") and a disc drive for reading from and writing to removable non-volatile discs (for example CD-ROMs, DVD-ROMs or other optical media) may be provided. In these cases, each drive may be connected to the bus 618 through one or more data medium interfaces. The memory 628 may comprise at least one program product, and the program product has a set of (for example, at least one) program modules that are configured to perform the functions of the embodiments of the present disclosure.

A program/utility facility 640 having a set of (at least one) program modules 642 may be stored in, for example, the memory 628. Such program modules 642 include but are not limited to an operating system, one or more application programs, other program modules, and program data. Each of these examples or a combination thereof may comprise the implementation of a network environment. The program modules 642 generally execute the functions and/or methods in the embodiments of the present disclosure.

The computer device 612 may communicate with one or more external devices 614 (for example, a keyboard, a pointing device, a display 624, etc.), and may communicate with one or more devices that enable a user to interact with the computer device 612, and/or communicate with any device (for example, a network card, a modem, etc.) that enables the computer device 612 to communicate with one or more other computing devices. Such communication may be performed through an input/output (I/O) interface 622. In addition, the computer device 612 may communicate with one or more networks (for example, a local area network (LAN), a wide area network (WAN), and/or a public network, for example the Internet) through a network adapter 620. As shown, the network adapter 620 communicates with other modules of the computer device 612 through the bus 618. It should be understood that, although not shown, other hardware and/or software modules may be used together with the computer device 612, including but not limited to: microcodes, device drivers, redundant processing units, external disk drive arrays, RAID systems, tape drives and data backup storage systems, etc.

The processor 616 executes various functional applications and data processing by running programs stored in the system memory 628, for example to implement the optical proximity effect correction method in the embodiments of the present disclosure. The method comprises:

fabricating a test pattern mask according to design rules of a target pattern;

obtaining data required by an optical proximity effect correction model, and establishing the optical proximity effect correction model;

obtaining line end shortening data of the test pattern, and establishing a line end shortening rule table;

determining an initial correction value according to the line end shortening rule table; and correcting the target pattern according to the initial correction value and the optical proximity effect correction model.

Of course, it may be understood by those skilled in the art that the processor can implement the technical solution of the optical proximity effect correction method in any embodiment of the present disclosure.

An embodiment of the present disclosure further provides a computer-readable storage medium having computer programs stored thereon that, when executed by a processor, implement the optical proximity effect correction method in the embodiments of the present disclosure. The method comprises:

fabricating a test pattern mask according to design rules of a target pattern;

obtaining data required by an optical proximity effect correction model, and establishing the optical proximity effect correction model;

obtaining line end shortening data of the test pattern, and establishing a line end shortening rule table;

determining an initial correction value according to the line end shortening rule table; and correcting the target pattern according to the initial correction value and the optical proximity effect correction model.

Of course, the computer programs stored in the computer-readable storage medium in the embodiment of the present disclosure can perform related operations of the optical proximity effect correction method in any embodiment of the present disclosure, in addition to the above-mentioned method operations.

The computer storage medium in the embodiment of the present disclosure may be any combination of one or more computer-readable media. The computer-readable medium may be a computer-readable signal medium or a computer-readable storage medium. The computer-readable storage medium may be, but not limited to, an electrical, magnetic, optical, electromagnetic, infrared, or semiconductor system, apparatus, or device, or any combination thereof. More specific examples (non-exhaustive list) of the computer-readable storage medium comprise: electrical connections with one or more wires, portable computer disks, hard disks, random access memories (RAMs), read-only memories (ROMs), erasable programmable read only memories (EPROMs or flash memories), optical fibers, portable compact disk read only memories (CD-ROMs), optical storage devices, magnetic storage devices, or any suitable combination thereof. In this document, the computer-readable storage medium may be any tangible medium that contains or stores a program, and the program may be used by or together with an instruction execution system, apparatus, or device.

The computer-readable signal medium may comprise data signals propagated in the baseband or as part of carriers, and may carry computer-readable program codes. Such propagated data signals may be in various forms, including but not limited to electromagnetic signals, optical signals, or any suitable combination thereof. The computer-readable signal medium may be any computer-readable medium other than the computer-readable storage medium. The computer-readable medium may send, propagate, or transmit the program used by or together with an instruction execution system, apparatus, or device.

The program codes contained in the computer-readable medium may be transmitted by any suitable medium, including but not limited to wireless, wired, optical cable, RF, etc., or any suitable combination thereof.

The computer program code used to perform the operations of the present disclosure may be written in one or more programming languages or a combination thereof. The programming languages include object-oriented programming languages such as Java, Smalltalk, C++, and conventional procedural programming languages such as "C" language or similar programming languages. The program code may be executed entirely on the user's computer, partly on the user's computer, as an independent software package, partly on the user's computer and partly executed on a remote computer, or entirely executed on the remote computer or server. In the case of a remote computer, the remote computer may be connected to the user's computer through any kind of networks, including a local area network (LAN) or a wide area network (WAN), or may be connected to an external computer (for example, connected over Internet by the Internet service provider).

Note that the foregoing descriptions are only preferred embodiments of the present disclosure and the technical principles applied. It may be understood by those skilled in the art that the present disclosure is not limited to the specific embodiments described herein, and various apparent changes, adjustments and substitutions can be made without departing from the protection scope of the present disclosure. Therefore, although the present disclosure has been described in detail by the above embodiments, the present disclosure is not limited to those embodiments and can comprise more other equivalent embodiments without departing from the concept of the present disclosure. The scope of the present disclosure is defined the appended claims.

What is claimed is:

1. An optical proximity effect correction method, comprising:
   fabricating a test pattern mask according to design rules of a target pattern;
   obtaining data required by an optical proximity effect correction model, and establishing the optical proximity effect correction model;
   obtaining line end shortening data of the test pattern, and establishing a line end shortening rule table;
   determining an initial correction value according to the line end shortening rule table; and
   correcting the target pattern according to the initial correction value and the optical proximity effect correction model;
   wherein, after the obtaining data required by an optical proximity effect correction model and establishing the optical proximity effect correction model, the method further comprises:
   verifying the optical proximity effect correction model, and comparing line end shortening data obtained by the optical proximity effect correction model with the line end shortening data of the test pattern; and
   determining the optical proximity effect correction model meets application conditions if an absolute value of a difference between the line end shortening data obtained by the optical proximity effect correction model and the line end shortening data of the test pattern is less than or equal to a preset threshold.

2. The optical proximity effect correction method according to claim 1, further comprising:
   cyclically performing the correcting the target pattern, until the line end shortening of the target pattern reaches to a target value.

3. The optical proximity effect correction method according to claim 1, further comprising:
   if the absolute value of the difference between the line end shortening data obtained by the optical proximity effect correction model and the line end shortening data of the test pattern is greater than the preset threshold, performing model-based optical proximity effect correction until the absolute value of the difference between the line end shortening data obtained by the optical proximity effect correction model and the line end shortening data of the test pattern is less than or equal to the preset threshold.

4. The optical proximity effect correction method according to claim 1, wherein, when photolithography conditions change, the optical proximity effect correction model and the line end shortening rule table are re-established.

5. The optical proximity effect correction method according to claim 1, wherein the line end shortening rule table comprises pattern line widths, pattern spacings, and line end shortening lengths corresponding to the pattern line widths and the pattern spacings.

6. The optical proximity effect correction method according to claim 5, wherein the determining an initial correction value according to the line end shortening rule table comprises:
   using a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;
   using a corresponding line end shortening length in the line end shortening rule table as the initial correction value, if the pattern line width and the pattern spacing of the target pattern are both in the line end shortening rule table; and
   using 0 as the initial correction value, if the pattern line width and the pattern spacing of the target pattern are respectively greater than a maximum value of the pattern line width and a maximum value of the pattern spacing in the line end shortening rule table.

7. The optical proximity effect correction method according to claim 6, wherein the initial correction value is 70 nm when the minimum value of the pattern line width and the minimum value of the pattern spacing are both 50 nm;
   the initial correction value is between 0 nm and 70 nm when the pattern line width and the pattern spacing are both between 50 nm and 100 nm; and
   the initial correction value is 0 nm when the maximum value of the pattern line width and the maximum value of pattern spacing are both 100 nm.

8. A computer device, comprising:
   one or more processors; and
   a storage apparatus, configured to store one or more programs;
   when the one or more programs are executed by the one or more processors, the one or more processors implement the optical proximity effect correction method according to claim 1.

9. The computer device according to claim 8, wherein the optical proximity effect correction method further comprises:
   cyclically performing the correcting the target pattern, until the line end shortening of the target pattern reaches to a target value.

10. The computer device according to claim 8, wherein the optical proximity effect correction method further comprises:
    if the absolute value of the difference between the line end shortening data obtained by the optical proximity effect correction model and the line end shortening data of the test pattern is greater than the preset threshold, performing model-based optical proximity effect correction until the absolute value of the difference between the line end shortening data obtained by the optical proximity effect correction model and the line end shortening data of the test pattern is less than or equal to the preset threshold.

11. The computer device according to claim 8, wherein, when photolithography conditions change, the optical proximity effect correction model and the line end shortening rule table are re-established.

12. The computer device according to claim 8, wherein the line end shortening rule table comprises pattern line widths, pattern spacings, and line end shortening lengths corresponding to the pattern line widths and the pattern spacings.

13. The computer device according to claim 12, wherein the determining an initial correction value according to the line end shortening rule table comprises:
    using a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;

using a corresponding line end shortening length in the line end shortening rule table as the initial correction value, if the pattern line width and the pattern spacing of the target pattern are both in the line end shortening rule table; and using 0 as the initial correction value, if the pattern line width and the pattern spacing of the target pattern are respectively greater than a maximum value of the pattern line width and a maximum value of the pattern spacing in the line end shortening rule table.

14. The computer device according to claim 13, wherein the initial correction value is 70 nm when the minimum value of the pattern line width and the minimum value of the pattern spacing are both 50 nm;

the initial correction value is between 0 nm and 70 nm when the pattern line width and the pattern spacing are both between 50 nm and 100 nm; and the initial correction value is 0 nm when the maximum value of the pattern line width and the maximum value of pattern spacing are both 100 nm.

15. An optical proximity effect correction apparatus, comprising:

a test pattern generation module, configured to fabricate a test pattern mask according to design rules of a target pattern;

a model establishment module, configured to obtain data required by an optical proximity effect correction model and establish the optical proximity effect correction model;

a rule table establishment module, configured to obtain line end shortening data of the test pattern and establish a line end shortening rule table;

an initial value setting module, configured to determine an initial correction value according to the line end shortening rule table; and a correction module, configured to correct the target pattern according to the initial correction value and the optical proximity effect correction model;

wherein the model establishment module is further configured to verify the optical proximity effect correction model, and compare line end shortening data obtained by the optical proximity effect correction model with line end shortening data of the test pattern; determine the optical proximity effect correction model meets application conditions if an absolute value of a difference between the line end shortening data obtained by the optical proximity effect correction model and the line end shortening data of the test pattern is less than or equal to a preset threshold.

16. An optical proximity effect correction method, comprising:

fabricating a test pattern mask according to design rules of a target pattern;

obtaining data required by an optical proximity effect correction model, and establishing the optical proximity effect correction model;

obtaining line end shortening data of the test pattern, and establishing a line end shortening rule table;

determining an initial correction value according to the line end shortening rule table; and correcting the target pattern according to the initial correction value and the optical proximity effect correction model;

wherein the line end shortening rule table comprises pattern line widths, pattern spacings, and line end shortening lengths corresponding to the pattern line widths and the pattern spacings;

wherein the determining an initial correction value according to the line end shortening rule table comprises:

using a line end shortening length corresponding to a minimum value of the pattern line width and a minimum value of the pattern spacing in the line end shortening rule table as the initial correction value, if the pattern line width and the pattern spacing of the target pattern are respectively less than the minimum value of the pattern line width and the minimum value of the pattern spacing in the line end shortening rule table;

using a corresponding line end shortening length in the line end shortening rule table as the initial correction value, if the pattern line width and the pattern spacing of the target pattern are both in the line end shortening rule table; and using 0 as the initial correction value, if the pattern line width and the pattern spacing of the target pattern are respectively greater than a maximum value of the pattern line width and a maximum value of the pattern spacing in the line end shortening rule table.

17. The optical proximity effect correction method according to claim 16, wherein the initial correction value is 70 nm when the minimum value of the pattern line width and the minimum value of the pattern spacing are both 50 nm;

the initial correction value is between 0 nm and 70 nm when the pattern line width and the pattern spacing are both between 50 nm and 100 nm; and the initial correction value is 0 nm when the maximum value of the pattern line width and the maximum value of pattern spacing are both 100 nm.

* * * * *